United States Patent
Ziger

(10) Patent No.: US 6,613,589 B2
(45) Date of Patent: Sep. 2, 2003

(54) METHOD FOR IMPROVING SUBSTRATE ALIGNMENT

(75) Inventor: David H. Ziger, San Antonio, TX (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 33 days.

(21) Appl. No.: 09/826,839

(22) Filed: Apr. 6, 2001

(65) Prior Publication Data

US 2003/0005405 A1 Jan. 2, 2003

(51) Int. Cl.[7] ................................................ H01L 21/66
(52) U.S. Cl. ......................................................... 438/14
(58) Field of Search ...................................... 438/14, 18

(56) References Cited

U.S. PATENT DOCUMENTS

| | | | |
|---|---|---|---|
| 5,668,042 A | * | 9/1997 | Bae .............................. 438/18 |
| 5,877,861 A | | 3/1999 | Ausschnitt et al. |
| 6,338,971 B1 | * | 1/2002 | Yasuda et al. ................. 438/14 |

* cited by examiner

Primary Examiner—David Nelms
Assistant Examiner—Quoc D Hoang
(74) Attorney, Agent, or Firm—Peter Zawilski

(57) ABSTRACT

A method for improving substrate alignment on a stepper comprises imposing predetermined corrections on each of a plurality of substrates, a different set of corrections for each substrate. The actual corrections occurring on the substrates are measured and mathematically processed to produce a matrix and a plurality of equations. The equations are resolved to provide correct corrections for accurate alignment.

9 Claims, No Drawings

METHOD FOR IMPROVING SUBSTRATE ALIGNMENT

BACKGROUND OF THE INVENTION

This invention relates to the improvement of substrate alignment, for example in the manufacture of semiconductors.

The manufacture of semiconductors requires that patterned layers be aligned to specific underlying features. The amount of misalignment is readily measurable, using commercially available instruments and procedures. It is desirable to minimize misalignment. Exposure tools, such as a stepper, typically allow measured corrections to be entered so that alignment is improved on subsequent wafers.

Stepper alignment connections are typically made by measuring the alignment and reversing the measured component offsets.

There exists a problem in that one correction can interact with another, and also the response to a correction may be some fraction of the actual programmed value.

SUMMARY OF THE INVENTION

The present invention is concerned with improving the pattern alignment, i.e., reduce the pattern misalignment by calibrating the stepper and measuring component responses. These responses are regressed and input into a response matrix. The response matrix is then used to predict the required component offsets by solving the relevant set of linear equations.

Broadly, the invention is to a method for improving alignment of a substrate on a stepper, comprising the steps of imposing predetermined corrections for each of a plurality of substrates, a set of corrections for each substrate, measuring the actual corrections which occur on each substrate, mathematically processing the actual corrections to produce a matrix and provide a plurality of equations, and resolving the equations to provide a set of input corrections to provide a correct alignment.

DESCRIPTION OF A PREFERRED EMBODIMENT

A solution to the problem arising from the interrelations, or interactions, of the alignments can be obtained as follows.

The response of the stepper to known, forced, offsets is statistically calibrated. An example of such an experiment is shown in Table 1, which characterizes the effect of 8 corrections on alignment.

TABLE 1

Series of Characterization Runs Used to Calibrate Corrections

| Run | xtrans | ytrans | chipmag | chiprot | xWafRot | yWafRot | xWafMag | yWafMag |
|---|---|---|---|---|---|---|---|---|
| 1 | 0.07 | −0.07 | −4 | 4 | 2 | −2 | 2 | −2 |
| 2 | −0.07 | −0.07 | 4 | 4 | −2 | −2 | 2 | 2 |
| 3 | 0 | 0 | 0 | 0 | 0 | 0 | 0 | 0 |
| 4 | −0.07 | 0.07 | 4 | −4 | −2 | 2 | −2 | 2 |
| 5 | −0.07 | −0.07 | −4 | −4 | 2 | 2 | 2 | 2 |
| 6 | 0.07 | 0.07 | −4 | −4 | 2 | 2 | −2 | −2 |
| 7 | −0.07 | 0.07 | 4 | −4 | 2 | −2 | 2 | −2 |
| 8 | 0.07 | −0.07 | 4 | −4 | 2 | −2 | −2 | 2 |
| 9 | 0.07 | 0.07 | −4 | −4 | −2 | −2 | 2 | 2 |
| 10 | 0.07 | 0.07 | 4 | 4 | −2 | −2 | −2 | −2 |
| 11 | −0.07 | −0.07 | −4 | −4 | −2 | −2 | −2 | −2 |
| 12 | 0 | 0 | 0 | 0 | 0 | 0 | 0 | 0 |
| 13 | −0.07 | 0.07 | −4 | 4 | 2 | −2 | −2 | 2 |
| 14 | −0.07 | −0.07 | 4 | 4 | 2 | 2 | −2 | −2 |
| 15 | 0.07 | −0.07 | 4 | −4 | −2 | 2 | 2 | −2 |
| 16 | 0.07 | −0.07 | −4 | 4 | −2 | 2 | −2 | 2 |
| 17 | 0.07 | 0.07 | 4 | 4 | 2 | −2 | 2 | 2 |
| 18 | 0 | 0 | 0 | 0 | 0 | 0 | 0 | 0 |
| 19 | −0.07 | 0.07 | −4 | 4 | 2 | 2 | 2 | −2 |

Table 1 shows an example of a series of characterization runs used to calibrate the effect of eight independent stepper variables (xtranslation, ytranslation, chip magnification, chip rotation, x wafer magnification, y wafer magnification, x wafer rotation and y wafer rotation). The eight alignment variables are varied from low to high values along with replicates at baseline conditions in which the corrections are set to zero.

TABLE 2

Responses to the Characterization in Table 1

| Run | xtrans | ytrans | chipMag | chiprot | xWafMag | yWafMag | xWafRot | yWafRot |
|---|---|---|---|---|---|---|---|---|
| 1 | −0.08 | 0.07 | 3.63 | −6.06 | −2.08 | 2.16 | 2.03 | 1.77 |
| 2 | 0.10 | 0.07 | −2.80 | −2.86 | −1.66 | −1.79 | 2.08 | −2.01 |

TABLE 2-continued

Responses to the Characterization in Table 1

| Run | xtrans | ytrans | chipMag | chiprot | xWafMag | yWafMag | xWafRot | yWafRot |
|---|---|---|---|---|---|---|---|---|
| 3 | 0.02 | −0.01 | 0.69 | −0.79 | 0.06 | 0.13 | 0.11 | −0.04 |
| 4 | 0.06 | −0.07 | −3.04 | 4.95 | 1.96 | −1.95 | −1.87 | −1.87 |
| 5 | 0.09 | 0.06 | 4.30 | 1.36 | −1.96 | −1.98 | −1.85 | 1.95 |
| 6 | −0.07 | −0.07 | 4.10 | 1.40 | 1.79 | 2.08 | −1.85 | 1.98 |
| 7 | 0.08 | −0.07 | −2.98 | 1.20 | −1.71 | 2.12 | 2.17 | 1.97 |
| 8 | −0.05 | 0.07 | −3.22 | 0.94 | 2.17 | −1.92 | 2.07 | 2.03 |
| 9 | −0.08 | −0.07 | 4.55 | 5.20 | −2.18 | −1.91 | 2.04 | −1.82 |
| 10 | −0.06 | −0.08 | −3.19 | −2.93 | 2.06 | 2.18 | 2.12 | −2.02 |
| 11 | 0.06 | 0.07 | 4.34 | 4.88 | 1.75 | 2.12 | 2.17 | −1.84 |
| 12 | 0.01 | 0.00 | 0.68 | −0.87 | 0.01 | 0.02 | 0.21 | 0.02 |
| 13 | 0.10 | −0.07 | 4.17 | −6.68 | 2.02 | −1.85 | 2.16 | 1.67 |
| 14 | 0.08 | 0.07 | −3.33 | −6.71 | 2.21 | 2.13 | −1.85 | 1.66 |
| 15 | −0.04 | 0.07 | −2.93 | 4.77 | −1.65 | 2.11 | −1.91 | −1.86 |
| 16 | −0.07 | 0.07 | 4.33 | −2.66 | 1.69 | −1.95 | −1.87 | −2.07 |
| 17 | −0.06 | −0.08 | −2.89 | −6.49 | −1.76 | −1.93 | −1.92 | 1.77 |
| 18 | 0.03 | 0.00 | 0.65 | −1.07 | 0.00 | 0.10 | 0.14 | 0.00 |
| 19 | 0.06 | −0.06 | 4.54 | −2.54 | −2.09 | 2.19 | −1.89 | −2.01 |

The alignment resulting from each of the runs shown in Table 1 is analyzed and decomposed into the alignment components as shown in Table 2. Note that the values in Table 2 do not match the values given in Table 1. Some values are nearly the opposite, others are nearly the same and still others are neither.

| | Meas | | | | | | | | 1 | | Input | |
|---|---|---|---|---|---|---|---|---|---|---|---|---|
| xTrans | = | −1.017 | 0.000 | 0.002 | 0.000 | 0.000 | 0.000 | 0.000 | 0.000 | xTrans | (1) |
| yTrans | | 0.000 | −1.010 | 0.000 | 0.000 | 0.000 | 0.000 | 0.000 | 0.000 | yTrans | |
| ChipMag | | 0.000 | 0.000 | −0.911 | 0.000 | 0.000 | 0.000 | −0.064 | 0.000 | ChipMag | |
| ChipRot | | 0.000 | 0.000 | −0.031 | −0.963 | 0.000 | 0.000 | −0.926 | 0.000 | ChipRot | |
| xWafMag | | 0.000 | 0.000 | 0.042 | 0.000 | −0.961 | 0.000 | 0.000 | 0.000 | xWafMag | |
| yWafMag | | 0.000 | 0.000 | 0.000 | 0.000 | 0.000 | −1.011 | 0.000 | −0.013 | yWafMag | |
| xWafRot | | 0.000 | 0.000 | 0.000 | 0.000 | 0.000 | 0.000 | 0.000 | −0.995 | xWafRot | |
| yWafRot | | 0.000 | 0.000 | 0.000 | −0.026 | 0.000 | 0.000 | 0.949 | 0.000 | yWafRot | |

The interactions of the various correlations is evident. In particular, the measured chip rotation, as a function of the input corrections, is given by:

$$\text{ChipRot}^{Meas}=0.031\times\text{ChipMag}^{Input}-0.963\times\text{ChipRot}^{Input}-0.926\times\text{xWaferRot}^{Input}$$

The response to the programmed correction can be generalised as:

$$X^{Meas}=RX^{Input} \quad (2)$$

where $X^{Input}$ is the array of input corrections, R is the matrix response and $X^{Meas}$ is the array of measured results.

In practice, a stepper generates a wafer with a certain misalignment. Suppose the components of this misalignment are given by $X^{Meas}$. Then the set of inputs to exactly reverse the measured misalignment is found by:

$$X^{Input}=-R^{-1}X^{Meas} \quad (3)$$

where $R^{-1}$ is the inverse of R. For a measured response, there is only one set of new input conditions that will null out misalignment.

The above allows a stepper stage to be calibrated to better predict the response from forced corrections. A different calibration table can be produced for each of a number of steppers. Also, it is possible to generalize the above to quadratic systems.

While the invention has been described particularly with respect to substrates comprising semiconductor wafers, it is possible to apply the invention to other forms of substrates where multiple positioning corrections are necessary. It is applicable wherever multiple positioning corrections are applied to a member.

What is claimed is:

1. A method for improving alignment of a substrate on a stepper comprising the steps of:
    imposing a predetermined correction to the stepper for each of a plurality of substrates;
    measuring an actual correction resulting from the imposed predetermined correction for each of the plurality of substrates;
    mathematically processing a set of the actual corrections to produce a response matrix for providing a plurality of equations; and
    solving the plurality of equations to obtain a set of input corrections to provide a correct alignment of a substrate on said stepper.

2. The method according to claim 1 wherein the imposed predetermined correction for each of the plurality of substrates comprises a plurality of independently imposed component alignment corrections.

3. The method according to claim 2 wherein the step of measuring the actual correction includes the step of determining a plurality of component actual alignment corrections, which component actual alignment corrections comprise in aggregate the measured actual correction.

4. The method according to claim 3 wherein the step of mathematically processing includes the step of regressing the plurality of component actual alignment corrections determined for each of the plurality of substrates to obtain a set of component response values.

5. The method according to claim 4 wherein the step of mathematically processing includes the step of arranging the set of component response values into a response matrix for providing the plurality of equations.

6. The method according to claim 5 wherein each equation of the plurality of equations is an empirical linear equation of at least some of the variable component alignment corrections.

7. The method according to claim 5 wherein each equation of the plurality of equations is an empirical quadratic equation of at least some of the variable component alignment corrections.

8. The method according to claim 1 comprising the step of providing the set of input corrections to the stepper.

9. The method according to claim 8 wherein the set of input corrections comprises a set of independent component offset values for effecting component alignment corrections.

* * * * *